(12) United States Patent
Han et al.

(10) Patent No.: US 9,054,809 B2
(45) Date of Patent: Jun. 9, 2015

(54) RADIO FREQUENCY OPTICAL MODULE AND OPTICAL TRANSMISSION APPARATUS INCLUDING THE SAME

(71) Applicants: Electronics and Telecommunications Research Institute, Daejeon (KR); Phovel.co.LTD, Daejeon (KR)

(72) Inventors: Young-Tak Han, Daejeon (KR); Jang Uk Shin, Daejeon (KR); Sang Ho Park, Daejeon (KR); Yongsoon Baek, Daejeon (KR); Jeong Soo Kim, Daejeon (KR)

(73) Assignees: Electronics and Telecommunications Research Institute, Daejeon (KR); Phovel.co.LTD, Daejeon (KR)

( * ) Notice: Subject to any disclaimer, the term of this patent is extended or adjusted under 35 U.S.C. 154(b) by 0 days.

(21) Appl. No.: 14/175,225

(22) Filed: Feb. 7, 2014

(65) Prior Publication Data
US 2014/0328595 A1 Nov. 6, 2014

(30) Foreign Application Priority Data
May 6, 2013 (KR) .................. 10-2013-0050737

(51) Int. Cl.
*H04B 10/2575* (2013.01)
*H01S 5/022* (2006.01)
*H01S 5/024* (2006.01)

(52) U.S. Cl.
CPC ......... *H04B 10/2575* (2013.01); *H01S 5/02453* (2013.01); *H01S 5/02256* (2013.01);
(Continued)

(58) Field of Classification Search
CPC .............. H01S 3/0405; H01S 5/02415; H01S 5/02453; H01S 5/02476; H01S 5/0261; H01S 5/0262; H01S 5/02212; H01S 5/02236; H01S 5/02244; H01S 5/02248; H01S 5/02256

USPC ........................................... 372/36
See application file for complete search history.

(56) References Cited

U.S. PATENT DOCUMENTS 6,920,161 B2    7/2005  Riaziat et al.
7,061,949 B1 *  6/2006  Zhou et al. ............ 372/36
(Continued)

FOREIGN PATENT DOCUMENTS

KR    10-0456308 B1    11/2004

OTHER PUBLICATIONS

Tien-Tsorng Shih et al., "A 25 Gbit/s Transmitter Optical Sub-Assembly Package Employing Cost-Effective TO-CAN Materials and Processes", Journal of Lightwave Technology, Mar. 15, 2012, pp. 834-840, vol. 30, No. 6.

(Continued)

*Primary Examiner* — Xinning Niu
(74) *Attorney, Agent, or Firm* — Rabin & Berdo, P.C.

(57) ABSTRACT

Provided is a transistor outline (TO)-CAN type optical module and an optical transmission apparatus including the same. The optical module includes a stem, a thermo-electric cooler (TEC) on the stem, a first sub-mount on the TEC, an optical element on the first sub-mount, a plurality of electrode lead wirings inserted from an outside to an inside of the stem and disposed adjacent to the TEC and the optical element, a second sub-mount between the electrode lead wirings and the optical element, radio frequency (RF) transmission lines on the second sub-mount, a plurality of bonding wires connecting the RF transmission lines and the optical element, and the RF transmission lines and the electrode lead wirings, and an impedance matching unit disposed around the RF transmission lines and the electrode lead wirings, and controlling impedances of the RF transmission lines and the electrode lead wires.

24 Claims, 9 Drawing Sheets

(52) U.S. Cl.
CPC ......... *H01S5/02244* (2013.01); *H01S 5/02236* (2013.01); *H01S 5/02415* (2013.01); *H01S 5/02212* (2013.01)

(56) References Cited

U.S. PATENT DOCUMENTS

2002/0181522 A1* 12/2002 Rookes et al. ............. 372/38.02
2004/0131096 A1* 7/2004 Lee ................................ 372/36
2007/0159773 A1* 7/2007 Deng et al. ................... 361/600

OTHER PUBLICATIONS

Tien-Tsorng Shih et al., "High-Performance Low-Cost 10-Gb/s Coaxial DFB Laser Module Packaging by Conventional TO-Can Materials and Processes", IEEE Journal of Selected Topics in Quantum Electronics, Sep./Oct. 2006, pp. 1009-1016, vol. 12, No. 5.

* cited by examiner

RADIO FREQUENCY OPTICAL MODULE AND OPTICAL TRANSMISSION APPARATUS INCLUDING THE SAME

CROSS-REFERENCE TO RELATED APPLICATIONS

This U.S. non-provisional patent application claims priority under 35 U.S.C. §119 of Korean Patent Application No. 10-2013-0050737, filed on May 6, 2013, the entire contents of which are hereby incorporated by reference.

BACKGROUND OF THE INVENTION

The present invention disclosed herein relates to an optical transmission apparatus and, more particularly, to a transistor outline (TO)-CAN type optical module and an optical transmission apparatus including the same.

Typically, an optical module has had a structure of a butterfly or TO-CAN based package having a dual-in-line (DIL) pin layout. Nowadays, an optical module has been fabricated by using a legacy butterfly of a mini-DIL type or TO-CAN based miniature package that are recommended by the 10 Gbps miniature device-multiple source agreement (XMD-MSA), which is an industry standard. The legacy butterfly package not only structurally employs copper-tungsten (CuW), which has excellent thermal conductivity, as a bottom surface of the package, but also is very advantageous to impedance matching for a radio frequency (RF) operation. Thus, it has been mainly applied to an optical module having 10 Gbps or higher operation speed and allowing a cooled operation to be enabled. However, this legacy butterfly package is not proper to a low cost optical module, because packaging subsidiary materials used for the legacy butterfly type optical module are expensive and it is not easy to fabricate the legacy butterfly package. On the contrary, a TO-CAN based optical module can be fabricated in a miniature size, and a fabricating cost thereof can also be greatly lowered compared to the legacy butterfly scheme.

However, when a directly modulated laser (DML) of an edge-emitting scheme in which a light is emitted not from a top surface but from a side surface of a chip is required to use in a TO-CAN based optical transmission module, the DML chip is attached to a top surface of an 'L' shape block connected to a stem of the TO-CAN package, and then a light is output in a longitudinal direction of the TO-CAN package and is coupled to an optical fiber. In the above-described TO-CAN package structure, a radio frequency electrical signal penetrates through the stem of the TO-CAN package and is transferred to a DML through a protruding lead and bonding wire. A TO-CAN stem portion may be designed and fabricated in a structure where impedance matching is easily performed, but the lead and bonding wire protruding outside the TO-CAN stem have high inductances due to limited diameters and relatively long lengths. As a result, impedance values thereof are easily increased to several hundred ohms. Since this may be a main cause for seriously degrading radio frequency characteristics of the optical module having the TO-CAN package structure, the methods of obtaining excellent radio frequency characteristics are to lower inductance values of the lead and the boding wire and match the impedances in 25 ohm (for a single-ended configured DML driver) or 50 ohm (for a differential configured DML driver).

Furthermore, since the TO-stem used in the TO-CAN based optical module is required to allow laser-welding with a cover cap included in the TO-CAN to be enabled, Kovar material is used which has greatly lower thermal conductivity than CuW. In order to apply the DML chip to TO-CAN package as described above, an "L" block is additionally connected to the TO-stem and the DML chip is attached to a top surface of the "L" block. However, in this structure, a thermo-electric cooler (TEC) for cooling the DML chip is difficult to be employed and heat transfer efficiency for transferring heat generated in the DML chip gets lowered. Accordingly, the TO-CAN based optical module has been mainly applied to an uncooled operation which does not need cooling. Recently, a research on an optical module having a cooled operation scheme using a low-cost TO-CAN package is actively under development.

For the TO-CAN based optical module that a cooled operation is possible, a thermoelectric cooler (TEC) is disposed on the bottom of the TO-stem to increase heat dissipation efficiency and a reflective mirror is disposed to change a direction of a light output from the DML to a longitudinal direction of the TO-CAN package after the DML chip is attached to the top surface of the TEC. In this case, there may be two limitations from a viewpoint of high frequency operation. First, a length of the lead protruding from the TO-stem, which is as long as a height of the TEC, is further increased. Second, since a distance from an end of the lead to the DML chip is greatly increased compared to the typical TO-CAN based package structure that an uncooled operation is possible, a length of a boding wire from the lead to the DML chip becomes increased. In this case, the inductance values of the lead and the boding wire may become excessively increased, thus increasing impedance mismatch and seriously deteriorating a high frequency operation of the optical module. Thus, excellent high frequency characteristics may not be expected.

SUMMARY OF THE INVENTION

The present invention provides a transistor outline (TO)-CAN type optical module capable of preventing or minimizing impedance mismatch and an optical transmission apparatus including the same.

The present invention also provides a TO-CAN type optical module capable of improving radio frequency (RF) characteristics and an optical transmission apparatus including the same.

Embodiments of the inventive concept provide optical modules comprising: a stem; a thermo-electric cooler (TEC) on the stem; a first sub-mount on the TEC; an optical element on the first sub-mount; a plurality of electrode lead wirings inserted from an outside to an inside of the stem and disposed adjacent to the TEC and the optical element; a second sub-mount between the electrode lead wirings and the optical element; radio frequency (RF) transmission lines on the second sub-mount; a plurality of bonding wires connecting the RF transmission lines and the optical element, the plurality of bonding wires connecting the RF transmission lines and the electrode lead wirings; and an impedance matching unit disposed around the RF transmission lines and the electrode lead wirings, the impedance matching unit controlling impedances of the RF transmission lines and the electrode lead wirings.

In some embodiments, the impedance matching unit may include: a first impedance matching unit including the electrode lead wirings and disposed around the electrode lead wirings to match the impedance of the electrode lead wirings; and a second impedance matching unit including the RF transmission lines and disposed around the electrode lead wirings to match the impedance of the RF transmission lines.

In other embodiments, the first impedance matching unit may include a GND metal stand separated from another side of the electrode lead wirings which are opposite to the TEC and the second sub-mount.

In still other embodiments, the GND metal stand may have the same height as that of the second sub-mount including the TEC or that of the electrode lead wirings.

In even other embodiments, the GND metal stand may enclose the electrode lead wirings.

In yet other embodiments, the first impedance matching unit may further include a third sub-mount between the GND metal stand and the electrode lead wirings.

In further embodiments, the third sub-mount may include dielectric materials such as aluminium oxide, aluminium nitride, polyimide, or Teflon.

In still further embodiments, there may further include an adhesion metal layer between the third sub-mount and the GND metal stand.

In even further embodiments, the adhesion metal layer may include copper.

In yet further embodiments, the stem may have a cylindrical shape and the GND metal stand may have a trapezoidal surface which is separated at a constant distance from a side wall of the cylindrical shaped stem.

In much further embodiments, the GND metal stand may include: a ground metal; and gold plated on the ground metal.

In still much further embodiments, the second impedance matching unit may further include ground wirings disposed on both sides of the RF transmission lines on the second sub-mount.

In even much further embodiments, the first and second sub-mounts may have the same thickness.

In other embodiments of the inventive concept, optical transmission apparatuses include: a pulse generating unit generating an RF voltage signal; a signal driver connected to the pulse generating and converting the RF voltage signal into an RF current signal; and an optical module connected to the signal driver and transmitting an optical signal by using the RF current signal from the signal driver, wherein the optical module comprises: a stem; a TEC on the stem; a first sub-mount on the TEC; an optical element on the first sub-mount; a plurality of electrode lead wirings inserted from an outside to an inside of the stem and disposed adjacent to the TEC and the optical element; a second sub-mount between the electrode lead wirings and the optical element; RF transmission lines on the second sub-mount; a plurality of bonding wires connecting the RF transmission lines and the optical element, the plurality of bonding wires connecting the RF transmission lines and the electrode lead wirings; and an impedance matching unit disposed around the RF transmission lines and the electrode lead wirings, the impedance matching unit controlling impedances of the RF transmission lines and the electrode lead wirings.

In some embodiments, the optical transmission apparatus may further include a printed circuit board (PCB) having the signal driver mounted thereon.

In other embodiments, the optical transmission apparatus may further include a flexible PCB connecting the optical module and the PCB.

In still other embodiments, the optical transmission apparatus may further include an optical fiber aligned to the optical element.

In even other embodiments, the optical element may include a laser diode.

In yet other embodiments, the pulse generating unit may include a pulse power generator.

In further embodiments, the signal driver may include a laser diode driver.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings.

DETAILED DESCRIPTION OF PREFERRED EMBODIMENTS

Figure 1:
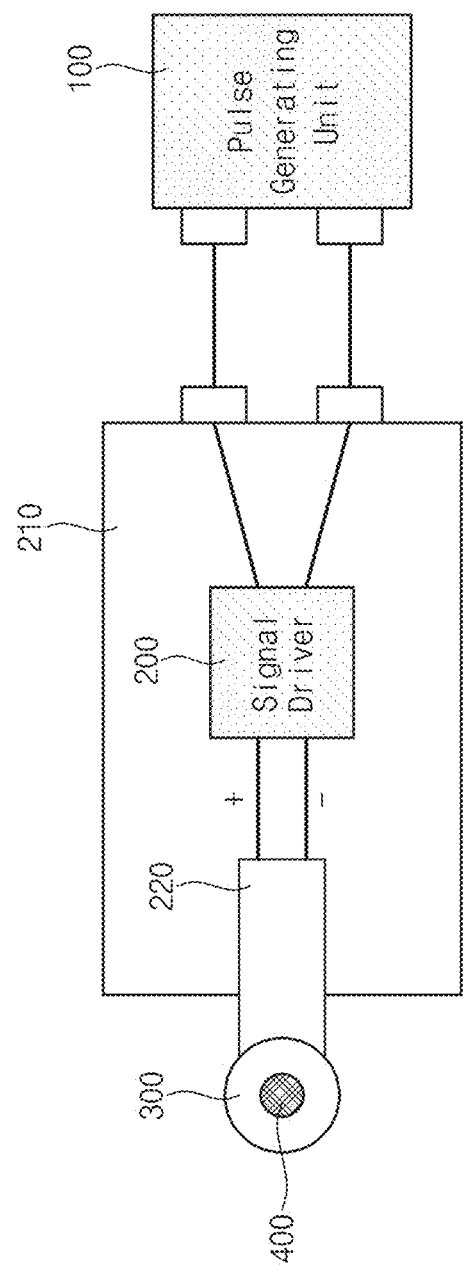
FIG. 1 illustrates an optical transmission apparatus according to an embodiment of the inventive concept.

Preferred embodiments of the inventive concept will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the inventive concept in conjunction with the accompanying drawings.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional views and/or plan views that are schematic illustrations of example embodiments. In the drawings, the thicknesses of layers and regions are exaggerated for clarity. As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features. Thus, the regions illustrated in the figures are schematic in nature and their shapes may be not intended to illustrate the actual shape of a region of a device and are not intended to limit the scope of example embodiments.

Referring to FIG. 1, an optical transmission apparatus according to an embodiment of the inventive concept may include a pulse generating unit 100, a signal driver 200, and a transistor outline (TO)-CAN type optical module 300. The pulse generating unit 100 may include a signal pattern generator. The signal pattern generator may generate a radio frequency (RF) voltage. The RF voltage may include an RF signal of about 1 GHz to about 100 GHz. The signal driver 200 may include a laser diode driver or an amplifier. The laser diode driver may convert the RF voltage into an RF current and amplify the RF current. The RF current may operate a laser diode in the TO-CAN type optical module 300. The signal driver 200 may be mounted on a main printed circuit board (PCB) 210. The main PCB 210 may be connected to the pulse generating unit 100.

The TO-CAN type optical module 300 may be interconnected with a flexible PCB 220, and the flexible PCB 220 may be connected to the main PCB 210. The TO-CAN type optical module 300 may output an optical signal through an optical fiber 400. RF characteristics of the TO-CAN type optical module 300 may depend on impedance values of wirings including interconnections in the module. The impedances thereof may be changed by inductances and capacitances of the wirings which transmit the RF signals. The TO-CAN type optical module 300 capable of matching impedances between the wirings is described with reference to embodiments.

Figure 2:
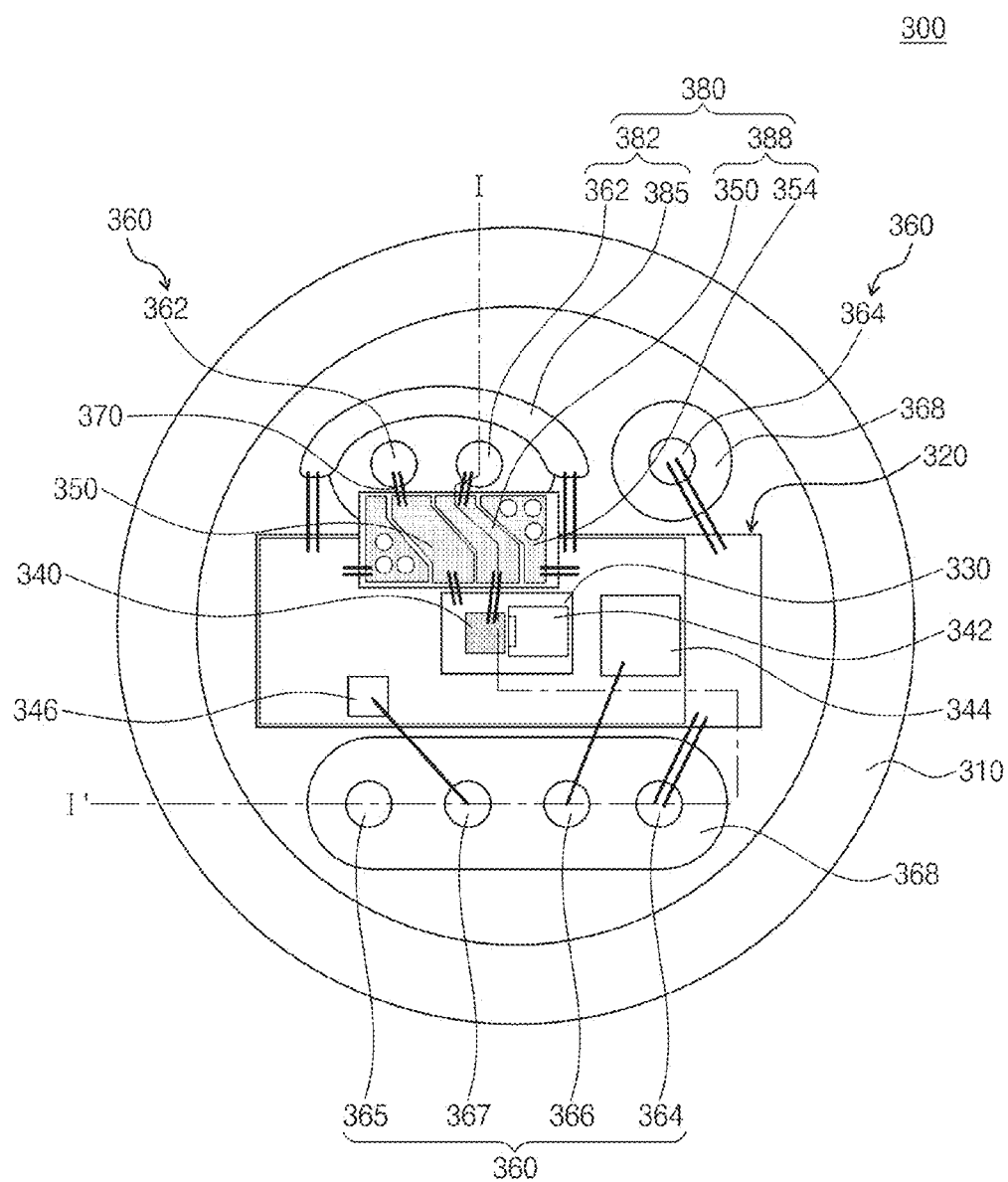
FIG. 2 is a plan view illustrating a TO-CAN type optical module according to a first embodiment of the inventive concept.
Figure 3:
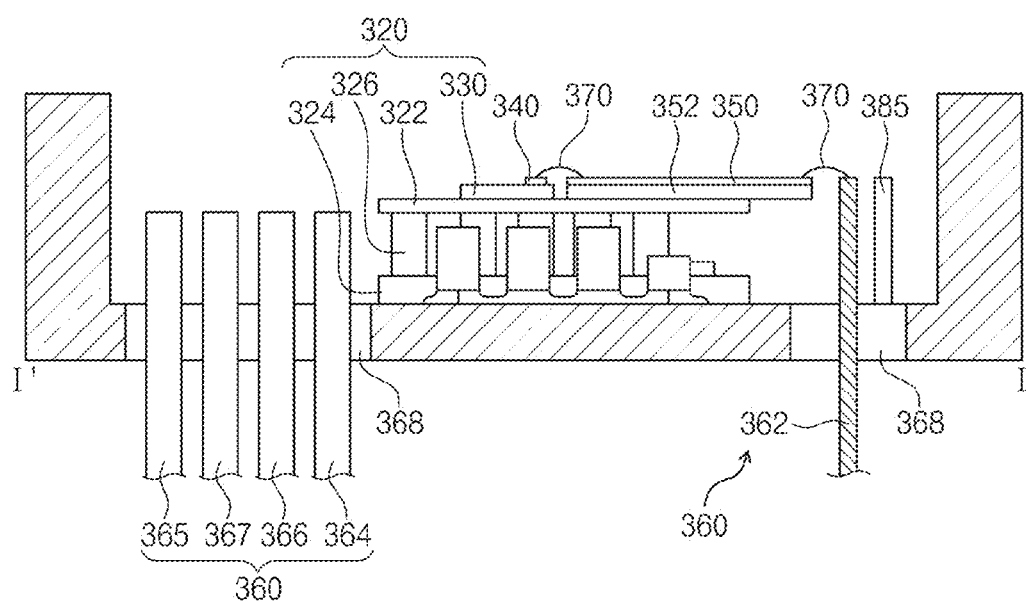
FIG. 3 is a cross-sectional view taken along a line I-I' of FIG. 2.

FIG. 2 is a plan view illustrating the TO-CAN type optical module 300 according to a first embodiment of the inventive concept. FIG. 3 is a cross-sectional view taken along a line I-I' of FIG. 2.

Referring to FIGS. 2 and 3, a thermo-electric cooler (TEC) 320 is arranged on a TO-stem 310, and lead wirings 360 connected to the TEC 320 are inserted inside the TO-stem 310. The TO-stem 310 may include a TO-CAN package. The TO-stem 310 may have a cylindrical shape. The lead wirings 360 are insulated from the TO-stem 310 by a glass insulator 368. The leas wirings 360 may include first to fourth dc distributors 364, 365, 366, and 367 and signal electrode lead wirings 362. The first dc distributors 364 may transmit a dc current to the TEC 320. The first dc distributors 364 may be separated from each other and at least one of them may have a coaxial shape. The second dc distributor 366 may provide a dc voltage to a photo detector 344. The third dc distributor 367 may be connected to a thermistor 346 through a bonding wire 370. The signal electrode lead wirings 362 may be formed in a ground-signal-signal-ground (GSSG) type and transmit differential RF electrical signals. The differential RF electrical signals may be transmitted in a mutually tightly confined state through a (+) signal lead and a (−) signal lead as shown in FIG. 1, and the signal leads are surrounded with a ground. Thus, impedance matching is easily performed and stable RF electrical signal transmission is possible. The TO-stem 310 is required to be connected to an electrical ground.

In the TEC 320, the first sub-mount 330, the optical element 340, the thermistor 346, the RF transmission lines 350, the second sub-mount 352, the electrode lead wirings 360, the bonding wires 370, and a first impedance matching unit 382 are arranged. The TEC 320 may keep temperature of the optical element 340 constant. The optical element 340 may be heated by the dc and RF signals. The TEC 320 may include a cooler side 322, a heater side 324, and pillars 326. The cooler side 322 may cool the optical element 340. The heater side 324 may be supported on the internal bottom of the TO-stem 310. The pillars 326 may be interposed between the cooler side 322 and the heater side 324. The pillars 326 may include at least one electrode which electrically connects the cooler side 322 and the heater side 324. The TEC 320 may be disposed on an internal center of the TO-stem 310.

The first sub-mount 330 may be disposed between the cooler side 322 of the TEC 320 and the optical element 340. The optical element 340 may be mounted on the first sub-mount 330. The first sub-mount 330 may insulate the optical element 340 from the cooler side 322 of the TEC 320. Although not shown in the drawing, a ground metal may be interposed between the first sub-mount 330 and the TEC 320.

The optical element 340 may include a laser diode. The optical element 340 of the laser diode may provide a laser light to the optical fiber 400. A 45 degree mirror 342 and the photo detector 344 may be disposed on the first sub-mount 330. The optical element 340, the 45 degree mirror 342, and the photo detector 344 may be arranged in one direction. The 45 degree mirror 342 transmits some of the laser light from the optical element 340 to the photo detector 344. The photo detector 344 may sense the laser light. The photo detector 344 may detect the optical signal. The laser light or the optical signal may be transmitted through an RF of about 10 Gbps or higher. Also the thermistor 346 is disposed another side of the TEC 320, which is opposite to the photo detector 344.

Referring to FIGS. 1 and 2, the signal driver 200 controlling the optical device 340 includes typical a differential output port, and signal terminals forming the differential output port have port impedance of 25 ohm, respectively. The signal driver 200 is classified as a single-ended drive scheme and a differential drive scheme according to a driving scheme of the optical element 340. For the single-ended drive, a negative (−) portion between signals forming the differential output port of the optical element 340 is terminated with a 25 ohm resistor at a port end of the signal driver 200 and only a positive (+) portion is connected to the optical element 340. Namely, since a single 25 ohm transmission line is connected inside the TO-stem 310, a GSSG type in the TO-stem 310 of FIG. 2 may be changed to a GSG type. Also, an impedance value of the GSG portion forming the inside of the TO-stem 310 is required to be designed to be a single-ended 25 ohm. On the contrary, for the differential drive scheme, (+/−) ports of the optical element 340 are not terminated, and the positive (+) and negative (−) signal portions are connected to the optical element 340 which is positioned inside the TO-stem 310. Since the positive (+) and negative (−) signal portions are connected to the signal driver 200 which has each 25 ohm port impedance, each of the signals is required to be transmitted in 25 ohm. However, since the (+/−) signals are transmitted together, the signals have differential 50 ohm impedance. Although described herein for the differential drive between the two driving schemes, an impedance matching structure is not limited thereto and the single-ended drive scheme may be also included. For the single-ended drive scheme, only a transmission line type of the TO-stem 310 and the first sub-mount 330 is differed, and a concept and a structure for impedance matching may be identically applied.

The second sub-mount 352 may be disposed on the TEC 320 between the first sub-mount 330 and the electrode lead wirings 360. The RF transmission lines 350 may be disposed on the second sub-mount 352. The first and second sub-mount 330 and 352 may have the same thickness. A separated distance between the electrode lead wirings 360 and the optical element 340 may be reduced by using the second sub-mount 352. The boding wires 370 may connect the RF transmission lines 350 and the optical element 340.

Furthermore, the signal electrode lead wirings 362 may have a height or a length considering thicknesses of the TEC 320, the second sub-mount 352 and the RF transmission lines 350 in the TO-stem 310. For example, the signal electrode lead wirings 362 may have a diameter of about 200 μm to about 500 on. The TEC 320 may have a height of about 2 mm to 5 mm from the bottom of the TO-stem 310. The impedances of the signal electrode lead wirings 362 may be increased according to frequencies of data signals. For example, when the optical element 340 operates at a high speed of 10 Gbps or higher, individual impedances of the signal electrode lead wirings 362 may be greatly increased to more than 100Ω. Here, differential impedances of the signal electrode lead wirings 362 may be increased to more than 50Ω. For example, impedance mismatch due to the increase in the impedance means noise generation and RF signal reflection at the signal electrode lead wirings 362. The RF signal reflection and noise generation may cause degradation of the RF characteristics of an optical module. The impedances may be proportional to inductances and inversely proportional to capacitances of the signal electrode lead wirings 362. The inductances of the signal electrode lead wirings 362 may be increased in proportion to lengths of the signal electrode lead wirings 362.

The impedance matching unit 380 may match impedances of the signal electrode lead wirings 362 and the RF transmission lines 350. The impedance matching unit 380 may include the first impedance matching unit 382 and a second impedance matching unit 388. The first impedance matching unit 382 may increase in capacitances between the signal electrode lead wiring 362 and GND by forming the GND around the signal electrode lead wirings 362. A GND metal stand 385 may be connected to the TO-stem 310 through a silver paste or a solder paste. The GND metal stand 385 may include a ground metal having high electrical conductivity, such as Al, CuW, or Kovar. Also, the GND metal stand 385 may include gold plated on the ground metal. Accordingly, the first impedance matching unit 382 may match the impedances by reducing increases in the impedances of the signal electrode lead wirings 362 or through impedance reduction. The signal electrode lead wirings 362 may be separated from the GND metal stand 385. An air gap may be formed between the signal electrode lead wirings 362 and the GND metal stand 385. The first impedance matching unit 382 may include the GND metal stand 385 and the air gap. The GND metal stand 385 may enclose around another side of the signal electrode lead wirings 362, which is opposite to the TEC 320 and the second sub-mount 352. That is, the GND metal stand 385 encloses the signal electrode lead wirings 362 in a curved shape and lowers the increased impedances, thereby improving the RF characteristics. The boding wires 370 may ground the GND metal stand 385. The GND metal stand 385 is interposed between a side wall of the TO-stem 310 and the signal electrode lead wirings 362. The GND metal stand 385 may have the same height or length as that of the second sub-mount 352 including the TEC or that of electrode lead wirings 362. The second sub-mount 352 may include an insulator such as a PCB, $Al_2O_3$, or MN.

The second impedance matching unit 388 includes the RF transmission lines 350 and ground wirings 354. The RF transmission lines 350 and the ground wirings 354 may be disposed on the second sub-mount 352. The ground wirings 354 are disposed on both sides of the RF transmission lines 350. The boding wires 370 may ground the second impedance matching unit 388. Impedances of the RF transmission lines 350 are proportional to inductances thereof and inversely proportional to capacitances thereof. The inductances may be increased in proportion to the lengths of the signal electrode lead wirings 362. The RF transmission lines 350 may be designed with about 50Ω differential impedance. Impedances of the RF transmission lines 350 may be matched through a precise design for the second impedance matching unit 388.

Thus, the RF characteristics of the TO-CAN type optical module according to a first embodiment of the inventive concept may be improved. The GND metal stand 385 and the GND of the second impedance matching unit 388 are illustrated as being connected to the GND on the TEC 320 through the boding wires 370 in FIG. 2, the GND metal stand 382 forming the first impedance matching unit 382 and the GND of the second impedance matching unit 388 may be connected to an external ground in common. A ground surface may be disposed on a front surface of the cooler side 322 of the TEC 320.

Figure 4:
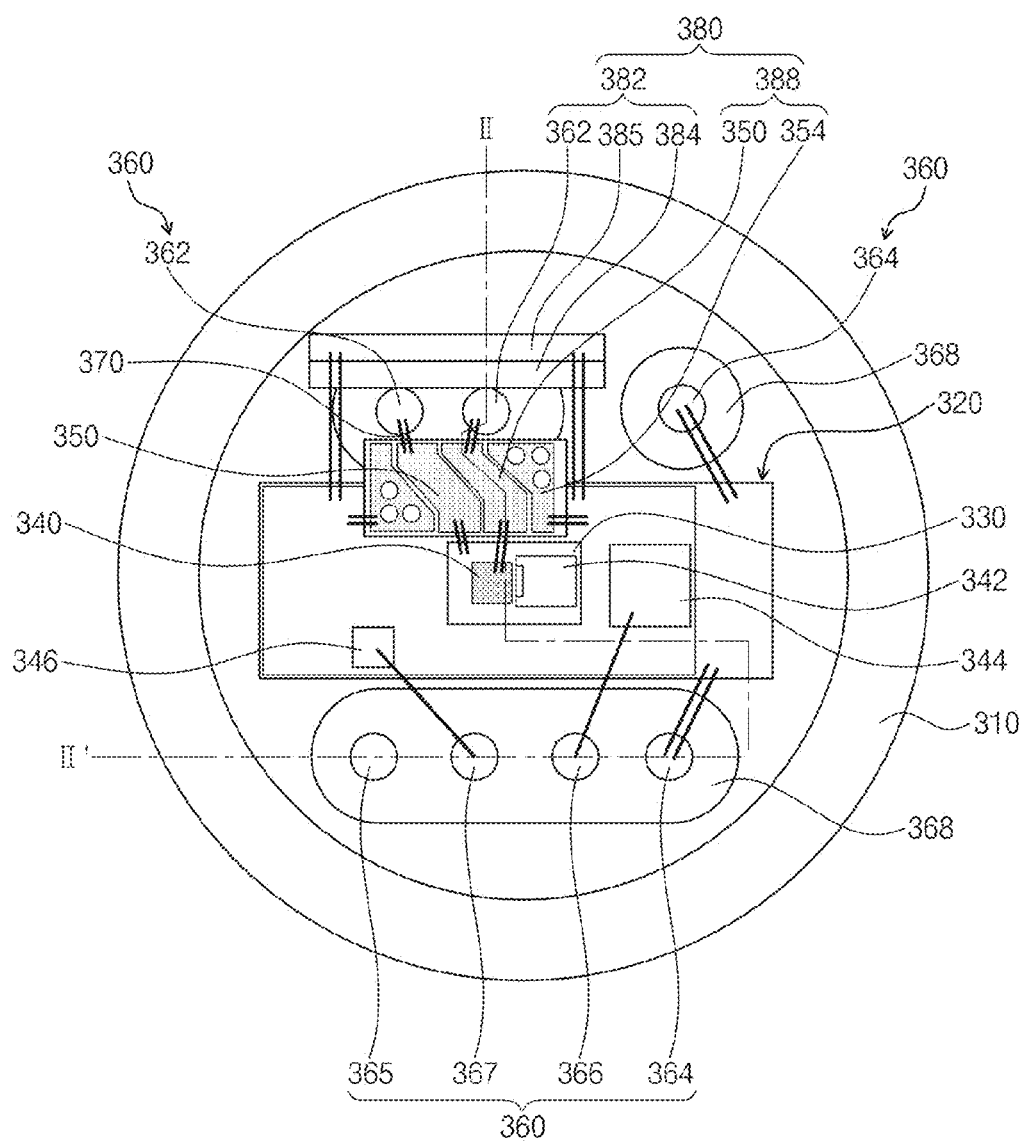
FIG. 4 is a plan view illustrating a TO-CAN type optical module according to a second embodiment of the inventive concept.
Figure 5:
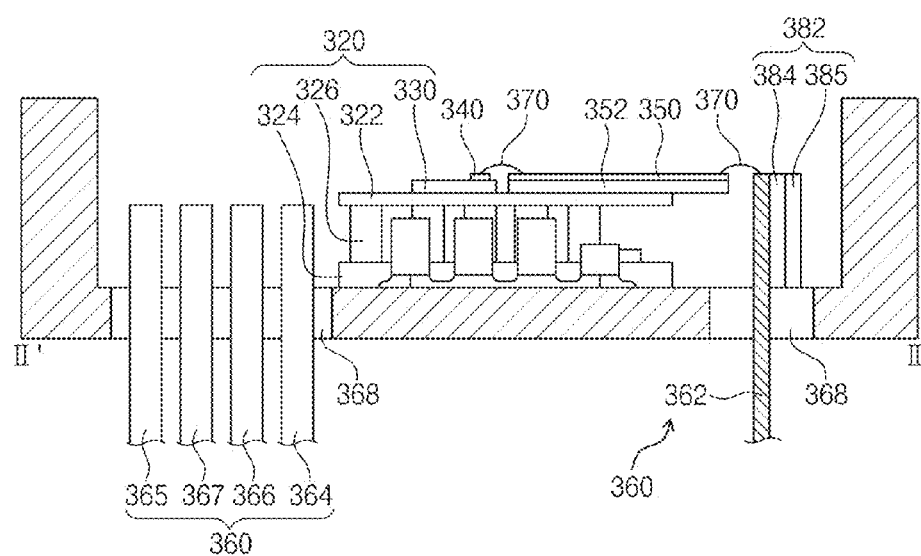
FIG. 5 is a cross-sectional view taken along a line II-II' of FIG. 4.

FIG. 4 is a plan view illustrating the TO-CAN type optical module 300 according to a second embodiment of the inventive concept. FIG. 5 is a cross-sectional view taken along a line II-II' of FIG. 4.

Referring to FIGS. 4 and 5, the TO-CAN type optical module according to the second embodiment of the inventive concept may include the GND metal stand 385 forming the first impedance matching unit 382 and a third sub-mount 384 between the signal electrode lead wirings 362 and the GND metal stand 385. The third sub-mount 384 may insulate the GND metal stand 385 from the signal electrode lead wirings 362. The second embodiment further includes the third sub-mount 384 between the GND metal stand 385 and the signal electrode lead wirings 362 in the first impedance matching unit 382 of the first embodiment.

Figure 6:
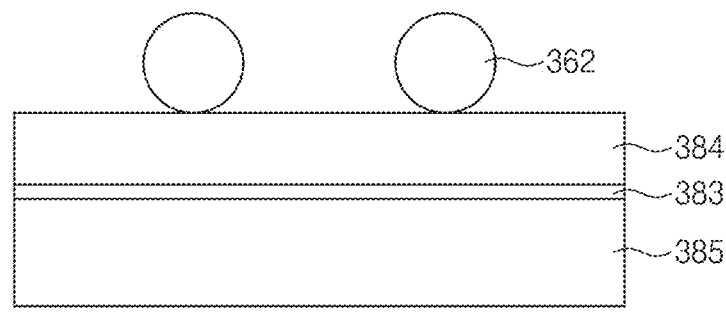
FIG. 6 is a cross-sectional view illustrating signal electrode lead wirings, a GND metal stand which is a component of the first impedance matching unit, an adhesion metal layer, and a third sub-mount.

FIG. 6 is a cross-sectional view illustrating the signal electrode lead wirings 362, the GND metal stand 385 forming the first impedance matching unit 382, an adhesion metal layer 383, and the third sub-mount 384.

Referring to FIG. 6, the first impedance matching unit 382 may further include the adhesion metal layer 383 between the GND metal stand 385 and the third sub-mount 384. The adhesion metal layer 383 may include copper having about 6 μm to 32 μm thickness. The GND metal stand 385 may include a gold-plated ground metal. The third sub-mount 384 may include a material such as aluminium oxide ($Al_2O_3$), aluminium nitride (AlN), polyimide, or Teflon.

Figure 7:
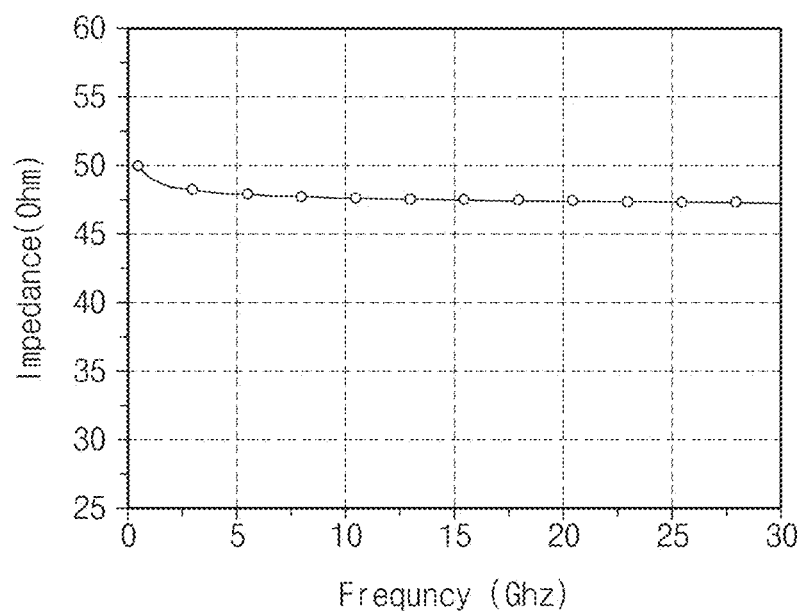
FIG. 7 is a graph illustrating a calculation result of impedance matching characteristics.

FIG. 7 is a graph illustrating a calculation result of impedance matching characteristics.

Referring to FIG. 7, the impedances of the signal electrode lead wirings 362 may be matched at differential 47.5 ohm, which is close to 50 ohm, when the RF increases to 30 GHz. The signal electrode lead wirings 362 may be disposed adjacent to the GND metal stand 385 and the third sub-mount 384.

Figure 8:
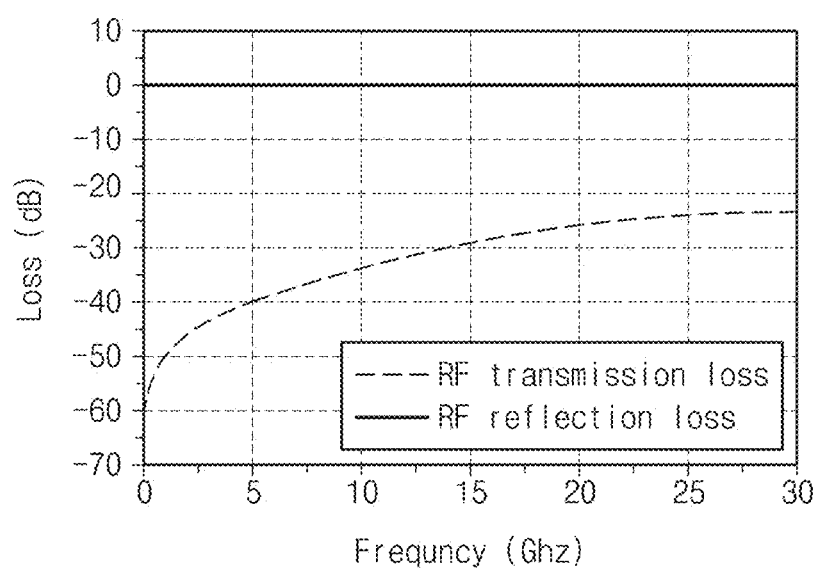
FIG. 8 is a graph illustrating transmission and reflection loss characteristics for RF signal.

FIG. 8 is a graph illustrating transmission loss and reflection loss characteristics for an RF signal.

Referring to FIG. 8, the signal electrode lead wirings 362 may have an RF reflection loss of about −20 dB or less and an RF transmission loss of about 0.1 dB or less when a frequency increases to 30 GHz.

The reflection and transmission losses in the RF may increase in proportion to a frequency of the RF signal.

By using the GND metal stand 385 and the third sub-mount 384, the impedances of the signal electrode lead wirings 362 may be matched and the reflection and transmission losses in the RF may be reduced.

Figure 9:
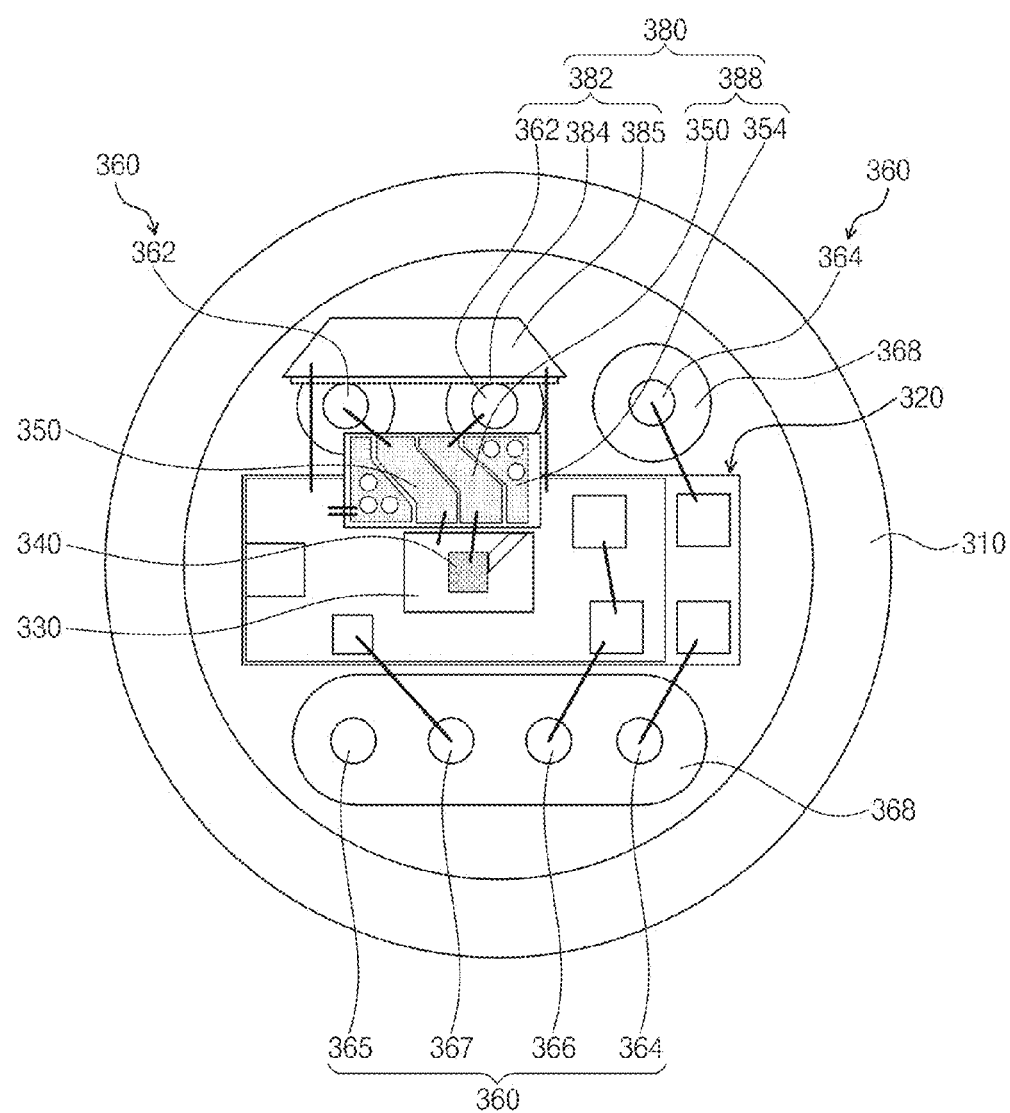
FIG. 9 is a plan view illustrating a TO-CAN type optical module according to a first application example of the present invention.

FIG. 9 is a plan view illustrating the TO-CAN type optical module 300 according to a first application example of the present invention.

Referring to FIG. 9, the TO-CAN type optical module 300 according to the first application example of the present invention may include the GND metal stand 385 having a trapezoidal cross-section. The third sub-mount 384 and the GND metal stand 385 may be disposed vertically on the bottom of the TO-stem 310. In the GND metal stand 385, one surface (not shown) joined to the third sub-mount 384 has a broader area than another surface (not shown) which is not joined. An edge portion of the GND metal stand 385, which is joined to the third sub-mount 384, may be slantly removed to form the trapezoidal cross-section. Accordingly, the GND metal stand 385 may be easily mounted in the TO-stem 310.

The signal electrode lead wirings 362 may be separated from each other between the second and third sub-mounts 352 and 384. The glass insulator 368 may individually enclose a plurality of signal electrode lead wirings 362 in the TO-stem 310. The first application example has a structure that the GND metal stand 385 in the second embodiment has the trapezoidal cross-section and the signal electrode lead wirings 362 are separated by a stem metal.

Figure 10:
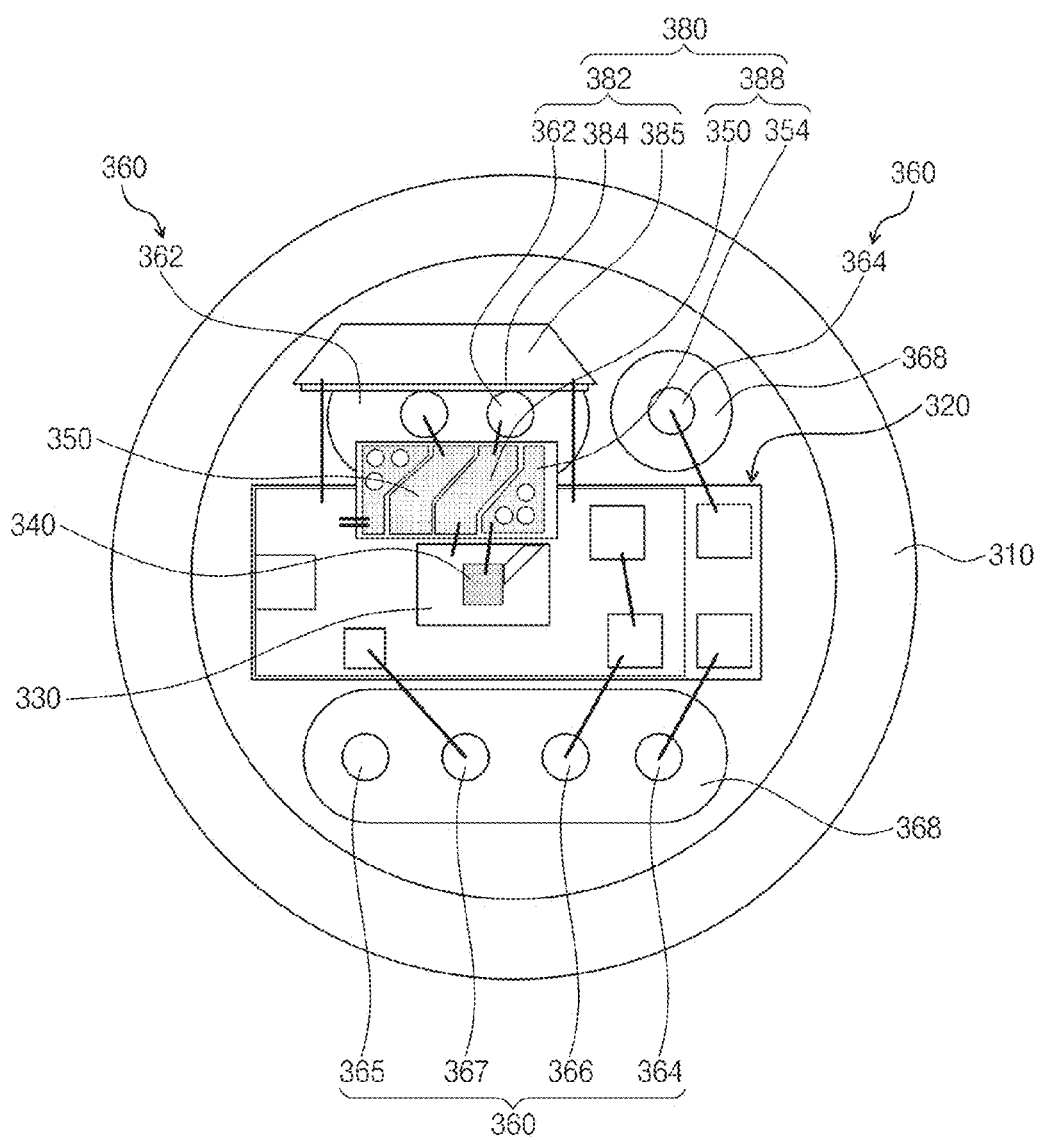
FIG. 10 is a plan view illustrating a TO-CAN optical module according to a second application example of the present invention.

FIG. 10 is a plan view illustrating the TO-CAN type optical module 300 according to a second application example of the present invention.

Referring to FIG. 10, the TO-CAN type optical module 300 according the second application example of the present invention may include the plurality of signal electrode lead wirings 362 in a single glass insulator 369. The glass insulator 368 may be formed inside the TO-stem 310. The second application example has the glass insulator 368 enclosing together the plurality of signal electrode lead wirings 362 in the first application example. The signal electrode lead wirings 362 of the second application example may be disposed closer together than those of the first application example. The first impedance matching unit 382 may match the impedances of the signal electrode lead wirings 362.

A TO-CAN type optical module according to embodiments of the inventive concept may include a stem, a thermoelectric cooler (TEC), a first sub-mount, an optical element, a second sub-mount, RF transmission lines, electrode lead wirings, bonding wires, and an impedance matching unit. The stem may include a TO-CAN package. The TEC may be disposed on the stem and keep temperature of an optical element constant. The first sub-mount may insulate the optical element from the TEC. The optical element may include a laser diode. The second sub-mount may have the same thickness or level as that of the first sub-mount on the TEC. The RF transmission lines may be disposed on the second sub-mount. The electrode lead wirings may be disposed on the second sub-mount. The electrode lead wirings may have a length from the bottom of the stem to the TEC, the first and second sub-mounts, the height or level of the RF transmission lines. The bonding wires may connect the optical element, the RF transmission lines, and the electrode lead wirings with each other. Impedances of the RF transmission lines and the electrode lead wirings may be increased when RF is increased. The impedance matching unit can match impedances during transmission and reception of the RF signals.

Thus, the TO-CAN type optical module and the optical transmission apparatus including the same can improve the RF signal transmission characteristics.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An optical module comprising:
   a stem;
   a thermo-electric cooler (TEC) on the stem;
   a first sub-mount on the TEC;
   an optical element on the first sub-mount;
   a plurality of electrode lead wirings inserted from an outside to an inside of the stem and disposed adjacent to the TEC and the optical element;
   a second sub-mount between the electrode lead wirings and the optical element;
   radio frequency (RF) transmission lines on the second sub-mount;
   a plurality of bonding wires connecting the RF transmission lines and the optical element, the plurality of bonding wires connecting the RF transmission lines and the electrode lead wires; and
   an impedance matching unit disposed around the RF transmission lines and the electrode lead wirings, the impedance matching unit controlling impedances of the RF transmission lines and the electrode lead wirings.

2. The optical module of claim 1, wherein the impedance matching unit comprises:
   a first impedance matching unit including the electrode lead wirings and disposed around the electrode lead wirings to match the impedances of the electrode lead wirings; and
   a second impedance matching unit including the RF transmission lines and disposed around the electrode lead wirings to match the impedances of the RF transmission lines.

3. The optical module of claim 2, wherein:
   the electrode lead wirings respectively have one side opposite to the TEC and the second sub-mount; and
   the first impedance matching unit comprises a GND metal stand separated from another side of the electrode lead wirings.

4. The optical module of claim 3, wherein the GND metal stand has the same height as that to the TEC, the second sub-mount, or the electrode lead wirings.

5. The optical module of claim 3, wherein the GND metal stand encloses the electrode lead wirings.

6. An optical module of claim 3, comprising:
   a stem;
   a thermo-electric cooler (TEC) on the stem;
   a first sub-mount on the TEC;
   an optical element on the first sub-mount;
   a plurality of electrode lead wirings inserted from an outside to an inside of the stem and disposed adjacent to the TEC and the optical element;
   a second sub-mount between the electrode lead wirings and the optical element;
   radio frequency (RF) transmission lines on the second sub-mount;
   a plurality of bonding wires connecting the RF transmission lines and the optical element, the plurality of bonding wires connecting the RF transmission lines and the electrode lead wires; and an impedance matching unit disposed around the RF transmission lines and the electrode lead wirings, the impedance matching unit controlling impedances of the RF transmission lines and the electrode lead wirings,
the impedance matching unit including:
a first impedance matching unit including the electrode lead wirings and disposed around the electrode lead wirings to match the impedances of the electrode lead wirings; and
a second impedance matching unit including the RF transmission lines and disposed around the electrode lead wirings to match the impedances of the RF transmission lines,
wherein the electrode lead wirings respectively have one side opposite to the TEC and the second sub-mount, and the first impedance matching unit comprises a GND metal stand separated from another side of the electrode lead wirings, and
the first impedance matching unit further comprises a third sub-mount between the GND metal stand and the electrode lead wirings.

7. The optical module of claim 6, wherein the third sub-mount comprises dielectric material such as aluminium oxide, aluminium nitride, polyimide, or Teflon.

8. The optical module of claim 6, further comprising an adhesion metal layer between the third sub-mount and the GND metal stand.

9. The optical module of claim 8, wherein the adhesion metal layer comprises copper.

10. The optical module of claim 6, wherein the stem has a cylindrical shape and the GND metal stand has a trapezoidal surface which is separated at a constant distance from a side wall of the cylindrical shaped stem.

11. The optical module of claim 3, wherein the GND metal stand comprises:
a ground metal; and
gold plated on the ground metal.

12. The optical module of claim 2, wherein the second impedance matching unit further comprises ground wirings disposed on both sides of the RF transmission lines on the second sub-mount.

13. The optical module of claim 1, wherein the first and second sub-mounts have the same thickness.

14. An optical transmission apparatus comprising:
a pulse generating unit generating an radio frequency (RF) voltage signal;
a signal driver connected to the pulse generating unit and converting the RF voltage signal into an RF current signal; and
an optical module connected to the signal driver and transmitting an optical signal by using the RF current signal from the signal driver, wherein the optical module comprises:
a stem;
a thermo-electric cooler (TEC) on the stem;
a first sub-mount on the TEC;
an optical element on the first sub-mount;
a plurality of electrode lead wirings inserted from an outside to an inside of the stem and disposed adjacent to the TEC and the optical element;
a second sub-mount between the electrode lead wirings and the optical element;
radio frequency (RF) transmission lines on the second sub-mount;
a plurality of bonding wires connecting the RF transmission lines and the optical element, the plurality of bonding wires connecting the RF transmission lines and the electrode lead wirings; and
an impedance matching unit disposed around the RF transmission lines and the electrode lead wirings, the impedance matching unit controlling impedances of the RF transmission lines and the electrode lead wirings.

15. The optical transmission apparatus of claim 14, further comprising a printed circuit board (PCB) having the signal driver mounted thereon.

16. The optical transmission apparatus of claim 15, further comprising a flexible PCB connecting the optical module and the PCB.

17. The optical transmission apparatus of claim 14, further comprising an optical fiber arranged to the optical element.

18. The optical transmission apparatus of claim 14, wherein the optical element comprises a laser diode.

19. The optical transmission apparatus of claim 14, wherein the pulse generating unit comprises a pulse power generator.

20. The optical transmission apparatus of claim 14, wherein the signal driver comprises a laser diode driver.

21. The optical module of claim 1, wherein the first sub-mount is separated from the second sub-mount by a gap.

22. The optical module of claim 1, wherein no RF transmission line is provided on the first sub-mount and no optical element is provided on the second sub-mount.

23. The optical transmission apparatus of claim 14, wherein the first sub-mount is separated from the second sub-mount by a gap.

24. The optical transmission apparatus of claim 14, wherein no RF transmission line is provided on the first sub-mount and no optical element is provided on the second sub-mount.

* * * * *